(12) United States Patent
Zafrany et al.

(10) Patent No.: US 9,407,259 B2
(45) Date of Patent: Aug. 2, 2016

(54) DRIVER CIRCUIT

(71) Applicant: FINISAR CORPORATION, Sunnyvale, CA (US)

(72) Inventors: Arik Zafrany, Santa Clara, CA (US); Georgios Kalogerakis, Mountain View, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 106 days.

(21) Appl. No.: 14/317,190

(22) Filed: Jun. 27, 2014

(65) Prior Publication Data

US 2015/0381172 A1 Dec. 31, 2015

(51) Int. Cl.
| | |
|---|---|
| *H03B 1/00* | (2006.01) |
| *H03K 3/00* | (2006.01) |
| *H03K 17/687* | (2006.01) |
| *H03F 3/45* | (2006.01) |
| *H01S 5/042* | (2006.01) |
| *H04B 10/50* | (2013.01) |

(52) U.S. Cl.
CPC .......... *H03K 17/6871* (2013.01); *H01S 5/0427* (2013.01); *H03F 3/45085* (2013.01); *H03F 3/45179* (2013.01); *H03F 3/45282* (2013.01); *H01S 5/042* (2013.01); *H03F 2203/45301* (2013.01); *H03F 2203/45554* (2013.01); *H03F 2203/45562* (2013.01); *H03F 2203/45598* (2013.01); *H03F 2203/45702* (2013.01); *H04B 10/502* (2013.01)

(58) Field of Classification Search
CPC ............ H03K 3/01; H03K 19/017509; H03K 19/017527; G05F 1/625
USPC ................. 327/108–112, 333, 427, 434, 437; 326/82, 83, 87
See application file for complete search history.

(56) References Cited

U.S. PATENT DOCUMENTS

| | | | |
|---|---|---|---|
| 7,135,884 B1 * | 11/2006 | Talbot .................. | H03K 17/164 326/30 |
| 2004/0114650 A1 | 6/2004 | Tanaka et al. | |
| 2009/0153219 A1 * | 6/2009 | Wu ........................ | H03F 1/0205 327/333 |
| 2010/0327940 A1 | 12/2010 | Eisenstadt et al. | |
| 2012/0163242 A1 | 6/2012 | Shimizu et al. | |
| 2015/0188627 A1 | 7/2015 | Yuda et al. | |

FOREIGN PATENT DOCUMENTS

WO        2014/038338 A1        3/2014

OTHER PUBLICATIONS

International Search Report and Written Opinion, as issued in connection with International Patent Application No. PCT/US2015/038148, mailed Sep. 7, 2015, 15 pgs.

* cited by examiner

*Primary Examiner* — Lincoln Donovan
*Assistant Examiner* — Thomas Skibinski
(74) *Attorney, Agent, or Firm* — Maschoff Brennan (57) ABSTRACT

A circuit may include first and second input nodes, first and second output nodes, first and second intermediate nodes, first and second resistances, a first amplification transistor coupled to the first input node, the first resistance, and the first intermediate node and a second amplification transistor coupled to the second input node, the second resistance, and the second intermediate node. The circuit may also include a first active device coupled to the first output node and the first intermediate node, a second active device coupled to the second output node and the second intermediate node, a first output transistor coupled to the first output node and configured to conduct based on a second intermediate signal on the second intermediate node, and a second output transistor coupled to the second output node and configured to conduct based on a first intermediate signal on the first intermediate node.

20 Claims, 4 Drawing Sheets

DRIVER CIRCUIT

FIELD

The embodiments discussed herein are related to a driver circuit.

BACKGROUND

Driver circuits may be implemented to drive electrical signals generated by one circuit to another circuit over a printed circuit board (PCB) trace, through an electrical connector, or over a transmission line of some other sort. For example, a driver circuit may drive electrical signals generated by a clock and data recovery circuit to a clocked data processing device.

In some circumstances, a driver circuit may be configured with pre-drivers that amplify an electrical signal before the electrical signal is driven by the driver circuit. Additionally, in some circumstances, a driver circuit may include additional circuitry at the output nodes for sending pre and/or post tap electrical signals on the output nodes along with a driven electrical signal. The pre and/or post tap electrical signals may compensate for signal loss of a driven electrical signal as the driven electrical signal is driven to another circuit.

A driver circuit within an integrated circuit or within a particular device may consume a significant amount of the power of the integrated circuit or the particular device. In particular, a driver circuit with a pre-driver and/or additional circuitry for sending pre and/or post tap electrical signals may consume a significant amount of power of an integrated circuit or a particular device.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to a driver circuit.

In an example embodiment, a circuit may include first and second input nodes configured to receive a differential input signal with a first voltage swing. The circuit may also include first and second output nodes and an amplification circuit coupled to the first and second input nodes. The amplification circuit may be configured to receive the differential input signal and to generate first and second intermediate signals based on the differential input signal. Both the first and second intermediate signals may include voltage swings that are larger than the first voltage swing. The circuit may also include a first active device coupled to the first output node and the amplification circuit. The first active device may be configured to conduct based on the first intermediate signal. The circuit may also include a second active device coupled to the second output node and the amplification circuit. The second active device may be configured to conduct based on the second intermediate signal. The circuit may also include an output circuit coupled to the amplification circuit and the first and second output nodes. The output circuit may be configured to output first and second output signals on the first and second output nodes based on the respective first and second intermediate signals.

In another example embodiment, a circuit may include first and second input nodes, first and second output nodes, first and second intermediate nodes, and first and second resistances. The circuit may also include a first amplification transistor coupled to the first input node, the first resistance, and the first intermediate node and a second amplification transistor coupled to the second input node, the second resistance, and the second intermediate node. The circuit may also include a first active device coupled to the first output node and the first intermediate node, a second active device coupled to the second output node and the second intermediate node, and a first output transistor coupled to the first output node. The first output transistor may be configured to conduct based on a second intermediate signal on the second intermediate node. The circuit may also include a second output transistor coupled to the second output node. The second output transistor may be configured to conduct based on a first intermediate signal on the first intermediate node.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Some embodiments described herein may include a driver circuit. The driver circuit may include an amplification circuit and an output circuit. The amplification circuit may be configured to translate a smaller voltage swing signal to a larger voltage swing signal at an intermediate node between the amplification circuit and the output circuit. The output circuit may use the larger voltage swing on the intermediate node to generate an output signal. In some embodiments, the larger voltage swing may be sufficient to cause metal-oxide-semiconductor field-effect transistor (MOSFET) transistors within the output circuit to conduct. In some embodiments, the output circuit may further include active devices that provide an output impedance that is approximately matched to an input impedance of a signal transmission line coupled to the output circuit. The active devices may not conduct when the MOSFET transistors conduct to reduce power consumption of the driver circuit.

Figure 1:
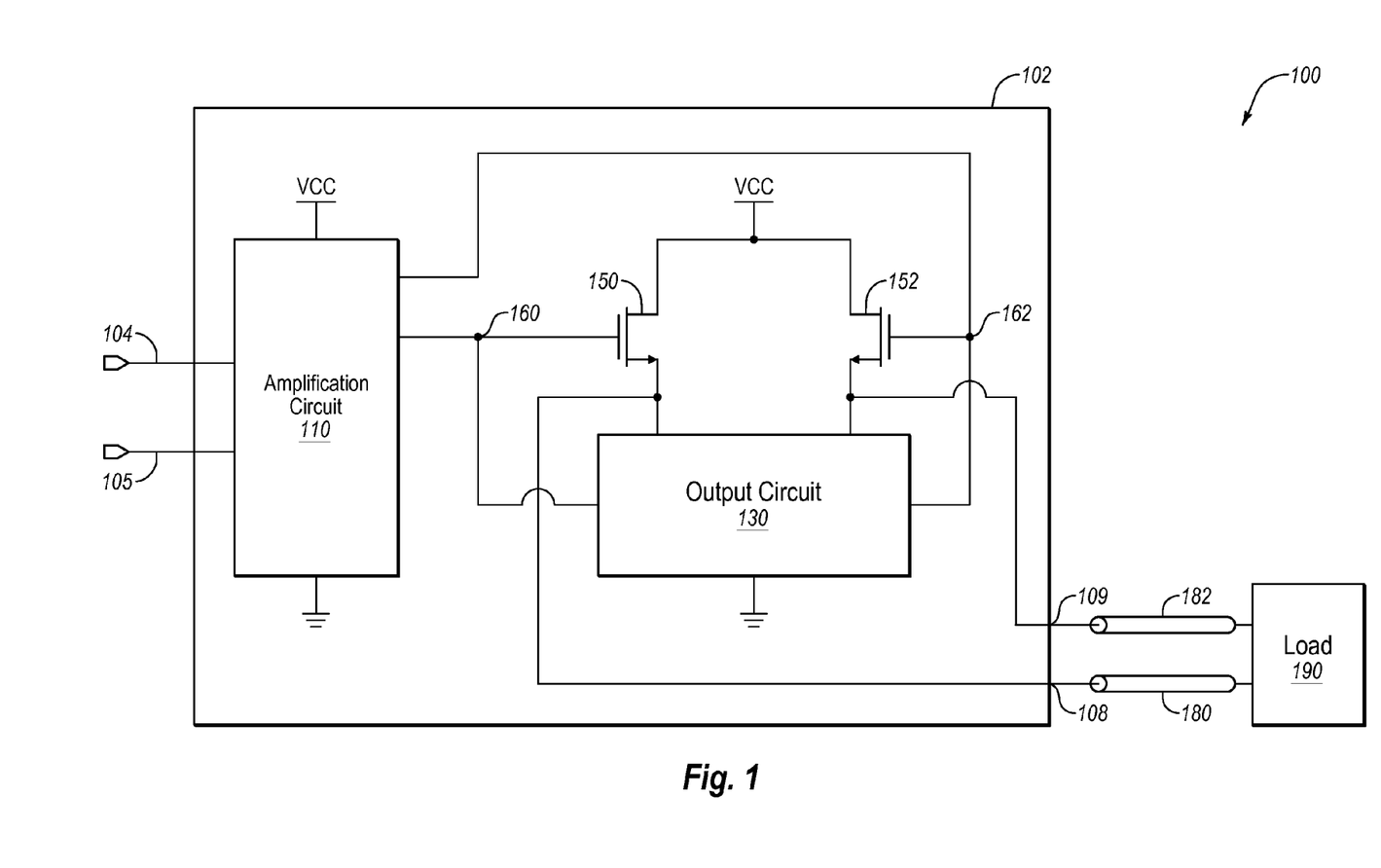
FIG. 1 illustrates a circuit that includes an example driver circuit.

FIG. 1 illustrates a circuit 100 that includes an example driver circuit 102, arranged in accordance with at least some embodiments described herein. The driver circuit 102 may include, but is not limited to, first and second input nodes 104 and 105, first and second output nodes 108 and 109, an amplification circuit 110, an output circuit 130, and first and second active devices 150 and 152. As illustrated in FIG. 1, the first and second output nodes 108 and 109 may be configured to be coupled to a load 190 by first and second signal transmission lines 180 and 182.

The first and second signal transmission lines 180 and 182 may be PCB traces or some other type of electrical leads and/or electrical connectors and/or some combination thereof for connecting the first and second output nodes 108 and 109 and the load 190. In some embodiments, the first and second signal transmission lines 180 and 182 may each include an input impedance. In some embodiments, the input impedances may be the same or different. In some embodiments, the input impedances of the first and second signal transmission lines 180 and 182 may be 25 ohms, 50 ohms, 75 ohms, 100 ohms, or some other impedance value.

The first and second input nodes 104 and 105 may be coupled to the amplification circuit 110. The amplification circuit 110 may be coupled to the output circuit 130 and the first and second active devices 150 and 152 at first and second intermediate nodes 160 and 162. In particular, the first active device 150 may be coupled to the first intermediate node 160. The second active device 152 may be coupled to the second intermediate node 162. The output circuit 130 and the first and second active devices 150 and 152 may be coupled to the first and second output nodes 108 and 109. In particular, the first active device 150 may be coupled to the first output node 108 and the second active device 152 may be coupled to the second output node 109.

The first and second input nodes 104 and 105 of the driver circuit 102 may be configured to receive an input differential signal. The input differential signal may be a high-speed or low-speed signal. For example, in some embodiments, the input differential signal may be a 200 megabits/second signal, a 500 megabits/second signal, a 1 gigabit/second signal (Gb/s), a 10 Gb/s signal, a 20 Gb/s signal, or a 40 Gb/s signal, among others.

The input differential signal may include a first input signal and a second input signal. For example, the first input signal may be a positive signal of the input differential signal and the second input signal may be the negative signal of the input differential signal. The first input node 104 may be configured to receive the first input signal and the second input node 105 may be configured to receive the second input signal.

The input differential signal may include a voltage swing. In these and other embodiments, the voltage swing of the input differential signal may refer to a minimum difference in voltages between the first signal and the second signal of the input differential signal to allow data to be demodulated from the input differential signal. In some embodiments, the first voltage swing may be sufficient to a cause a bipolar junction transistor (BJT) to conduct or not to conduct. For example, the voltage swing of the input differential signal may be between 100 and 400 millivolts. Alternately or additionally, the voltage swing of the input differential signal may be between 150 and 250 millivolts. In some embodiments, the voltage swing of the input differential signal may be approximately 200 millivolts. In these and other embodiments, the voltage swing of the input differential signal being approximately 200 millivolts may indicate that the voltage swing of the input differential signal is plus or minus 10 percent of 200 millivolts.

As used herein, the term "conduct" with respect to a transistor indicates that the transistor is in a non-cut-off region of operation, such as the linear or saturation region of operation, such that current flows between a source and a drain of the transistor. Thus, when a transistor is described as conducting or that it conducts, the transistor is in a non-cut-off region of operation. In contrast, when a transistor is described as not conducting or that it does not conduct, the transistor is in a cut-off region of operation such that high impedance is presented at a drain and a source of the transistor.

The first and second output nodes 108 and 109 may be configured to receive first and second output signals from the output circuit 130 and to transmit the first and second output signals to the load 190. The load 190 may include a resistive type load. For example, in some embodiments, the load 190 may include a current mode logic termination that is implemented with a 50-ohm resistor.

The amplification circuit 110 may be configured to receive the input differential signal from the first and second input nodes 104 and 105. The amplification circuit 110 may generate first and second intermediate signals based on the input differential signal. The amplification circuit 110 may output the first intermediate signal to the first intermediate node 160 and may output the second intermediate signal to the second intermediate node 162.

The first and second intermediate signals may each include a voltage swing that is larger than the voltage swing of the input differential signal. In some embodiments, the voltage swings of the first and second intermediate signals may be at least 450 millivolts. In some embodiments, the voltage swings of the first and second intermediate signals may be sufficient to cause a MOSFET transistor to conduct.

The amplification circuit 110 may be configured to generate the first and second intermediate signals using a resistance included in the amplification circuit 110. The resistance may include a resistive value that is larger than the input impedance of the first and second signal transmission lines 180 and 182. In some embodiments, the resistive value may be 2, 3, 4, 5, or some other rational multiple of the input impedance of the first and second signal transmission lines 180 and 182. By using a resistance that is larger than the input impedance of the first and second signal transmission lines 180 and 182, the power consumption of the driver circuit 102 may be reduced.

The first and second active devices 150 and 152 may include MOSFET transistors. Each of the first and second active devices 150 and 152 may include a gate terminal, a source terminal, and a drain terminal. As illustrated in FIG. 1, the source terminal may be the terminal with the arrow, the gate terminal may be the terminal with the parallel horizontal lines, and the drain terminal may be the other terminal. The gates of the first and second active devices 150 and 152 may be coupled to the first and second intermediate nodes 160 and 162, respectively. The drains of the first and second active devices 150 and 152 may be coupled to a voltage supply (VCC). The sources of the first and second active devices 150 and 152 may be coupled to the output circuit 130 and the first and second output nodes 108 and 109, respectively.

Each of the first and second active devices 150 and 152 may include an output resistance that is approximately equal to the input impedance of the first and second signal transmission lines 180 and 182. In particular, the output resistance of the first active device 150 may be approximately equal to the input impedance of the first signal transmission line 180. The output resistance of the second active device 152 may be approximately equal to the input impedance of the second signal transmission line 182. The output resistances of the first and second active devices 150 and 152 being approximately equal to the input impedances of the first and second signal transmission lines 180 and 182 may indicate that the output resistances of the first and second active devices 150 and 152 are plus or minus 10% of the input impedances of the first and second signal transmission lines 180 and 182.

The output circuit 130 may be configured to drive output signals on the first and second output nodes 108 and 109 based on the first and second intermediate nodes. For example, the output circuit 130 may drive a first output signal to a logical high on the first output node 108 when the second intermediate node 162 is at a logical high voltage level and the first intermediate node 160 is at a logical low level. When the first intermediate node 160 is at a logical low level, the first active device 150 may not conduct. As a result, a majority or all of the current sourced by the output circuit 130 to the first output node 108 may be provided to the first signal transmission line 180.

As another example, the output circuit 130 may drive a second output signal to a logical high on the second output node 109 when the first intermediate node 160 is at a logical high voltage level and the second intermediate node 162 is at a logical low level. When the second intermediate node 162 is at a logical low level, the second active device 152 may not conduct. As a result, a majority or all of the current sourced by the output circuit 130 to the second output node 109 may be provided to the second signal transmission line 182.

By providing the majority of or all of the current provided by the output circuit 130 to the first and second signal transmission lines 180 and 182, the power consumption of the driver circuit 102 may be reduced as compared to a driver circuit that splits the current provided by a corresponding driver circuit between a corresponding load and other circuit elements within the driver circuit.

For example, known driver circuits do not include circuit elements corresponding to the amplification circuit 110 and the first and second active devices 150 and 152 of the driver circuit 102. These known driver circuits may instead include a resistor or other passive circuit element(s) coupled between a voltage supply and an output node and a driving circuit coupled to the output node, with the output node coupled to a load. The current provided by the driving circuit when driving a signal to the load may be divided between the resistor and/or other passive circuit elements and the load. As a result, the driving circuit may include to provide twice the current used by the load so that the load receives its required current. Providing twice the current to the driver circuits increases the power consumption of these driver circuits. In contrast, the driver circuit 102 is configured so that a majority of or approximately all of the current provided by the output circuit 130 is provided to the first and second signal transmission lines 180 and 182, reducing the power consumption of the driver circuit 102 as compared to the known driver circuits discussed above. In some embodiments, the power consumption of the driver circuit 102 may be reduced by as much as a factor of two as compared to the known driver circuits discussed above with similar source voltages.

Furthermore, in some embodiments, the amplification circuit 110 and the output circuit 130 may be coupled between a voltage supply (VCC) that is less than 2 volts and ground. The reduced voltage of the VCC may further reduce the power consumption of the driver circuit 102.

Modifications, additions, or omissions may be made to the circuit 100 without departing from the scope of the present disclosure. For example, the driver circuit 102 may include one or more additional active or passive devices. Alternately or additionally, the amplification circuit 110 and the output circuit 130 may include various circuit elements. For example, the output circuit 130 may include one or more transistors, of any of various types, to drive signals on the first and second output nodes 108 and 109.

Figure 2:
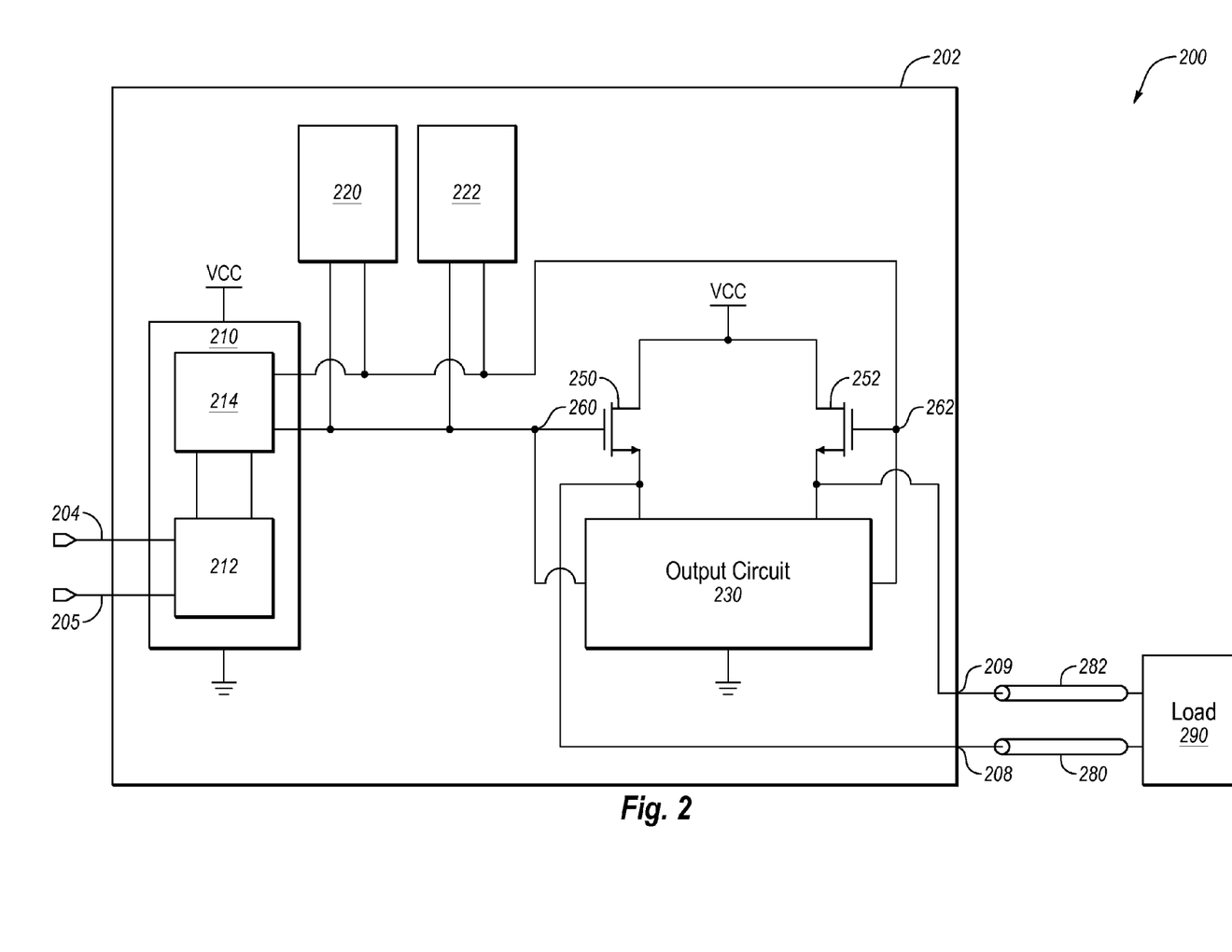
FIG. 2 illustrates another circuit that includes another example driver circuit.

FIG. 2 illustrates another circuit 200 that includes another example driver circuit 202, arranged in accordance with at least some embodiments described herein. The driver circuit 202 may include, but is not limited to, first and second input nodes 204 and 205, first and second output nodes 208 and 209, an amplification circuit 210, an output circuit 230, and first and second active devices 250 and 252. As illustrated in FIG. 2, the first and second output nodes 208 and 209 may be configured to be coupled to a load 290 by first and second signal transmission lines 280 and 282.

The first and second input nodes 204 and 205, the first and second output nodes 208 and 209, the output circuit 230, and the first and second active devices 250 and 252 may be analogous to the first and second input nodes 104 and 105, the first and second output nodes 108 and 109, the output circuit 130, and the first and second active devices 150 and 152 of FIG. 1. Accordingly, no further details of the first and second input nodes 204 and 205, the first and second output nodes 208 and 209, the output circuit 230, and the first and second active devices 250 and 252 are discussed with respect to FIG. 2.

The amplification circuit 210 may include a driver portion 212 and a load portion 214. The driver portion 212 may be coupled to the first and second input nodes 204 and 205 and the load portion 214. The load portion 214 may be coupled to first and second intermediate nodes 260 and 262.

The driver portion 212 may be configured to receive the input differential signal. Based on the input differential signal, the driver portion 212 may be configured to provide first and second currents to the load portion 214. The driver portion 212 may operate to provide the first and second currents based on a first voltage swing of the input differential signal. In some embodiments, the first voltage swing may be sufficient to cause a bipolar junction transistor (BJT) to conduct or not to conduct. For example, the voltage swing of the input differential signal may be between 100 and 400 millivolts. In these and other embodiments, the driver portion 212 may include BJT transistors that conduct based on the differential input signal to provide current to the load portion 214.

The load portion 214 may be configured to generate first and second intermediate voltage signals based on the current provided by the driver portion 212. The first and second intermediate voltage signals may be provided to the first and second intermediate nodes 260 and 262, respectively. The first and second intermediate voltage signals may include voltage swings that are greater than the first voltage swing of the input differential signal. In some embodiments, the voltage swings may be between 400 and 600 millivolts.

The load portion 214 may include first and second impedances. In some embodiments, the first and second impedances may be resistances, such as resistors. A value of the first and second impedances may be larger than an input impedance of the first and second signal transmission lines 280 and 282. In some embodiments, the first and second impedances may be 2, 3, 4, 5, or some other rational multiple of the input impedance of the first and second signal transmission lines 280 and 282.

The first and second intermediate voltage signals are provided to the first and second intermediate nodes 260 and 262, respectively. The output circuit 230 may generate first and second output signals based on the first and second intermediate voltage signals.

The driver circuit 202 may further include a post-tap circuit 220 and a pre-tap circuit 222. Each of the post-tap circuit 220 and the pre-tap circuit 222 may be coupled to the first and second intermediate nodes 260 and 262.

The post-tap circuit 220 may be configured to generate a post-cursor differential signal that is provided to the first and second intermediate nodes 260 and 262. The post-cursor differential signal may be a modified version of the input differential signal. In particular, the post-cursor differential signal may be a delayed version of the input differential signal. The post-cursor differential signal may further include emphasis on a rising/falling edge of the input differential signal. The emphasis may compensate for signal loss of the output signals as they are transmitted along the first and second signal transmission lines 280 and 282.

The pre-tap circuit 222 may be configured to generate a pre-cursor differential signal that is provided to the first and second intermediate nodes 260 and 262. The pre-cursor differential signal may be a modified version of the input differential signal. In particular, the pre-cursor differential signal may be an advanced version of the input differential signal. The pre-cursor differential signal may further include emphasis on a rising/falling edge of the input differential signal. The emphasis may compensate for signal loss of the output signals as they are transmitted along the first and second signal transmission lines 280 and 282.

By coupling the post- and pre-tap circuits 220 and 222 at the first and second intermediate nodes 260 and 262, the power consumed by the post- and pre-tap circuits 220 and 222 may be reduced as compared to other known driver circuits as discussed above. In particular, the power may be reduced because a majority of or all of the current sourced by the output circuit 230 based on the pre and post cursor differential signals are provided to the first and second signal transmission lines 280 and 282.

Modifications, additions, or omissions may be made to the circuit 200 without departing from the scope of the present disclosure. For example, the driver circuit 202 may include one or more additional active or passive devices. Alternately or additionally, the amplification circuit 210 and the output circuit 230 may include various circuit elements. For example, the output circuit 230 may include one or more transistors, of any of various types, to drive signals on the first and second output nodes 208 and 209.

Figure 3:
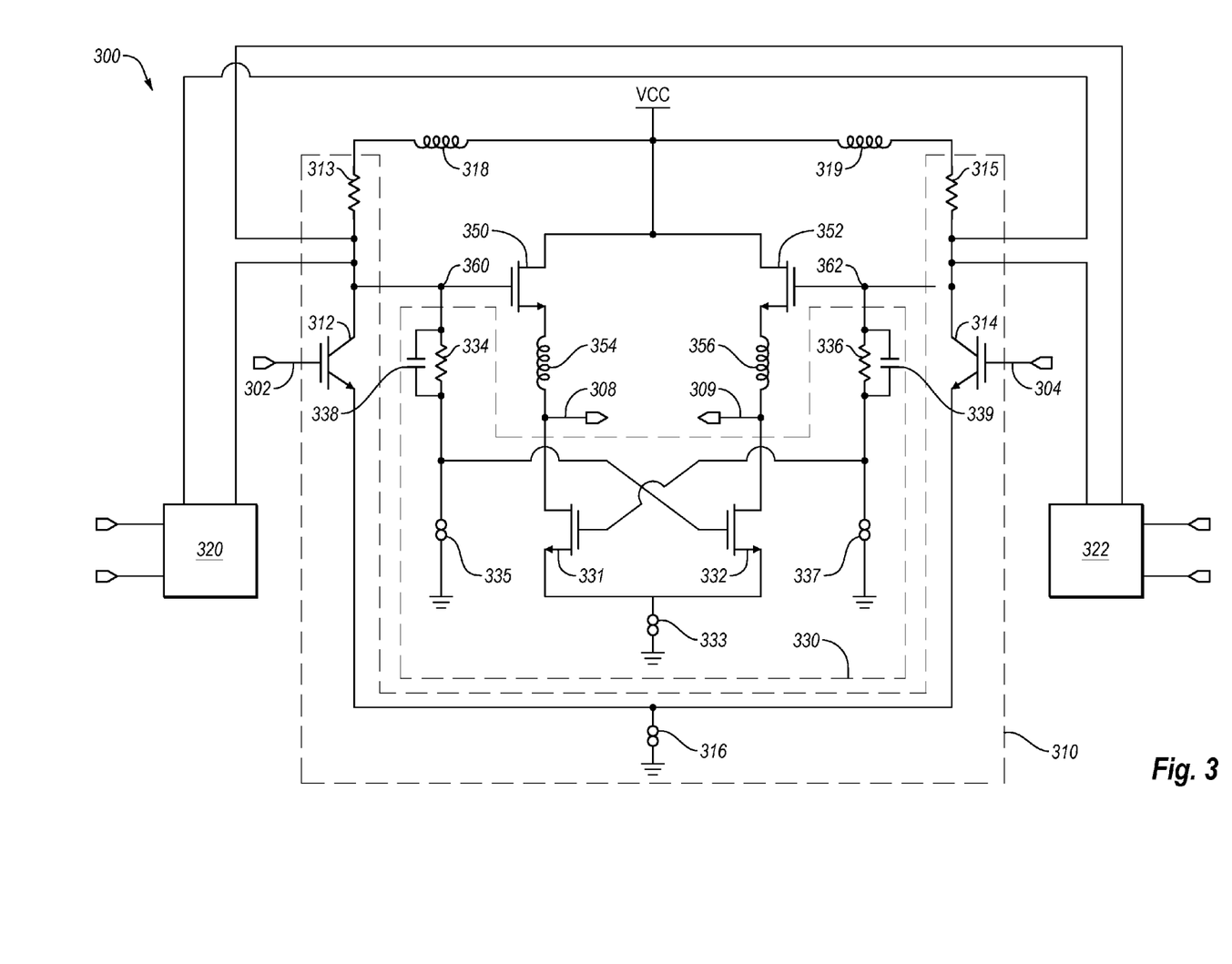
FIG. 3 illustrates another example driver circuit.

FIG. 3 illustrates another example driver circuit 300, arranged in accordance with at least some embodiments described herein. The driver circuit 300 may include, but is not limited to, first and second input nodes 302 and 304, first and second output nodes 308 and 309, an amplification circuit 310, an output circuit 330, first and second active devices 350 and 352, a pre-tap circuit 320, and a post-tap circuit 322.

The amplification circuit 310 may include first and second transistors 312 and 314, first and second resistances 313 and 315, and a first current source 316. The output circuit 330 may include third and fourth transistors 331 and 332, third and fourth resistances 334 and 336, second, third, and fourth current sources 333, 335, and 337, and first and second capacitances 338 and 339. The driver circuit 300 may further include first, second, third, and fourth inductors 318, 319, 354, and 356.

Each of the first and second active devices 350 and 352 and the first, second, third, and fourth transistors, 312, 314, 331, and 332 may include a gate terminal, a source terminal, and a drain terminal. As illustrated in FIG. 3, the source terminal may be the terminal with the arrow, the gate terminal may be the terminal with the parallel horizontal lines, and the drain terminal may be the other terminal.

The first input node 302 may be coupled to a gate of the first transistor 312. The drain of the first transistor 312 may be coupled to a first intermediate node 360. The source of the first transistor 312 may be coupled to the first current source 316. The first current source 316 may also be coupled to ground.

The second input node 304 may be coupled to a gate of the second transistor 314. The drain of the second transistor 314 may be coupled to a second intermediate node 362. The source of the second transistor 314 may be coupled to the first current source 316.

The first resistance 313 may be coupled between the first intermediate node 360 and VCC. The first inductor 318 may be coupled between VCC and the first resistance 313. The second resistance 315 may be coupled between the second intermediate node 362 and VCC. The second inductor 319 may be coupled between VCC and the second resistance 315.

The pre-tap circuit 320 may be coupled to both the first and second intermediate nodes 360 and 362. The post-tap circuit 322 may be coupled to both the first and second intermediate nodes 360 and 362.

A gate of the first active device 350 may be coupled to the first intermediate node 360. A drain of the first active device 350 may be coupled to VCC. A source of the first active device 350 may be coupled to the third inductor 354. A gate of the second active device 352 may be coupled to the second intermediate node 362. A drain of the second active device 352 may be coupled to VCC. A source of the second active device 352 may be coupled to the fourth inductor 356. The third and fourth inductors 354 and 356 may be coupled to the first and second output nodes 308 and 309.

The third resistance 334 may be coupled to the first intermediate node 360, the third current source 335, and a gate of the fourth transistor 332. The first capacitance 338 may be coupled to the first intermediate node 360, the third current source 335, and the gate of the fourth transistor 332. As such, the first capacitance 338 may be coupled in parallel with the third resistance 334. The first capacitance 338 may increase the bandwidth of the output circuit 330. In particular, the first capacitance 338 may generate a zero in the transfer function of the circuit 300 that may cancel out or partially cancel out the pole created by the third resistance 334 in the transfer function.

The fourth resistance 336 may be coupled to the second intermediate node 362, the fourth current source 337, and a gate of the third transistor 331. The second capacitance 339 may be coupled to the second intermediate node 362, the fourth current source 337, and the gate of the third transistor 331. As such, the second capacitance 338 may be coupled in parallel with the fourth resistance 336. The second capacitance 339 may increase the bandwidth of the output circuit 330. In particular, the second capacitance 339 may generate a zero in the transfer function of the circuit 300 that may cancel out or partially cancel out the pole created by the fourth resistance 336 in the transfer function.

A drain of the third transistor 331 may be coupled to the first output node 308 and the source of the third transistor 331 may be coupled to the second current source 333. The drain of the fourth transistor 332 may be coupled to the second output node 309 and the source of the fourth transistor 332 may be coupled to the second current source 333.

A discussion of an example operation of the driver circuit 300 follows. Assume that an input differential signal is provided on the first and second input nodes 302 and 304. The first input node 302 receives a first signal of the input differential signal that is a logical high and the second input node 304 receives a second signal of the input differential signal that is a logical low. The input differential signal may include a voltage swing of 250 millivolts.

The first signal may be received by the gate of the first transistor 312. The first transistor 312 may be a BJT transistor. The voltage of the first signal may be sufficient to cause the first transistor 312 to conduct. As the first transistor 312 conducts, a current flows through the first transistor 312 and the first resistance 313. A first voltage also develops at the first intermediate node 360 due to a voltage drop across the first resistance 313. The first voltage on the first intermediate node 360 may be at a level such that the first active device 350 does not conduct. As a result, there is no voltage drop across the first active device 350 and a voltage on the first output node 308 rises toward VCC.

Furthermore, the third current source 335 also may cause current to flow through the third resistance 334. A second voltage lower than the first voltage may develop on the gate of the fourth transistor 332 at a level such that the fourth transistor 332 does not conduct. As a result, the second current source 333 does not source or sink current to the second output node 309.

The second signal may be received at the gate of the second transistor 314. The second transistor 314 may be a BJT transistor. The voltage of the second signal may not be sufficient to cause the second transistor 314 to conduct. As a result, no current is drawn through the second resistance 315 and a third voltage that is approximately equal or equal to VCC develops on the second intermediate node 362. The third voltage on the second intermediate node 362 may be sufficient to cause the second active device 352 to conduct. A voltage drop may occur across the second active device 352 such that the voltage on the second output node 309 may sink toward ground.

Furthermore, the fourth current source 337 also may cause current to flow through the fourth resistance 336. A fourth voltage lower than the third voltage may develop on the gate of the third transistor 331 at a level such that the third transistor 331 conducts. As a result, the second current source 333 may provide current, e.g., source or sink current, to the first output node 308.

The current provided by the second current source 333 through the third transistor 331 may be all or approximately all provided to the first output node 308 because the first active device 350 is not conducting. In other known circuits, a resistor may be used in place of the first active device 350. As a result, half of the current provided by the second current source 333 would be used by the resistor and the other half would be provided to the first output node 308. As illustrated in FIG. 3, all or approximately all of the current provided by the second current source 333 may be provided to the first output node 308 because the first active device 350 does not conduct when the third transistor 331 conducts.

When the first signal changes to a logical low and the second signal changes to a logical high, the driver circuit 300 adjusts in a similar manner as described above such that the first active device 350 conducts and the third transistor 331 does not conduct to bring the first output node 308 toward ground. Furthermore, the second active device 352 may not conduct and the fourth transistor 332 may conduct such that the current provided by the second current source 333 is all or approximately all provided to the second output node 309 and the second output node 309 rises toward VCC.

Furthermore, in some embodiments, the first and second active devices 350 and 352 and the third and fourth transistors 331 and 332 may be MOSFET transistors that need a voltage swing at their gates of at least 500 millivolts to operate as a switch. The voltage swings produced at the first and second intermediate nodes may be sufficient to cause the first and second active devices 350 and 352 and the third and fourth transistors 331 and 332 to operate as switches as explained herein. For example, the difference between the first and third voltages and the difference between the second and fourth voltages may be more than 500 millivolts.

The third and fourth inductors 354 and 356 may be included to reduce a capacitance at the first and second output nodes 308 and 309. Reducing the capacitance at the first and second output nodes 308 and 309 may increase the speed of input differential signals that may be driven by the driver circuit 300. In some embodiments, the third and fourth inductors 354 and 356 may not be included in the driver circuit 300.

The first and second inductors 318 and 319 may be included for inductive peaking to increase a speed of input differential signals that may be driven by the driver circuit 300. In some embodiments, the first and second inductors 318 and 319 may not be included in the driver circuit 300.

The third and fourth resistances 334 and 336 and the third and fourth current sources 335 and 337 may be provided to reduce the voltage on the gates of the third and fourth transistors 331 and 332 with respect to the voltages on the drains of the third and fourth transistors 331 and 332 such that the third and fourth transistors 331 and 332 operate in the saturation region. In the saturation region, the third and fourth transistors 331 and 332 may more easily change from conducting and passing the current from the second current source 333 to not conducting and not passing the current from the second current source 333. In some embodiments, the third and fourth resistances 334 and 336 and the third and fourth current sources 335 and 337 may not be included in the driver circuit 300.

Thus, the driver circuit 300 may operate to convert an input differential signal with a first voltage swing to first and second intermediate voltages with second voltage swings larger than the first voltage swing that is sufficient for operation of MOSFET transistors. The first and second intermediate voltages may be used to cause the third and fourth transistors 331 and 332 to conduct or not conduct to drive first and second output signals on the first and second output nodes 308 and 309.

Furthermore, VCC used in the driver circuit 300 may be a low voltage. For example, the VCC may be lower than 2 volts, such as 1.4, 1.6, or 1.8 volts. The low voltage of the VCC in the driver circuit 300 may result in BJT transistors not being forward biased if BJT transistors are used as the third and fourth transistors 331 and 332. However, MOSFET transistors may be used as the third and fourth transistors with the low voltage of the VCC. MOSFET transistors use higher voltages to switch between a conducting state and a non-conducting state. The driver circuit 300 enables MOSFET transistors to drive the first and second output signals while also receiving an input differential signal that includes a voltage swing insufficient for switching of the MOSFET transistors. The driver circuit 300 further reduces power consumption by coupling the first and second active devices 350 and 352 to the first and second output nodes 308 and 309 in place of passive resistive devices.

Modifications, additions, or omissions may be made to the driver circuit 300 without departing from the scope of the present disclosure. For example, the driver circuit 300 may include one or more passive or active circuit elements. Alternately or additionally, the driver circuit 300 may include an $F_T$ doubler circuit. Alternately or additionally, the circuit 300 may not include the first and second capacitances 338 and 339.

In FIGS. 1, 2, and 3, the illustrated transistors are illustrated as metal-oxide-semiconductor field-effect transistor (MOSFET) transistors and BJT transistors. The above description uses the nomenclature gate, source, and drain to represent different terminals of the transistors. The use of the names gate, source, and drain may be used to describe generically the terminals of the MOSFET transistor, the BJT transistors, or other types of transistors, such as junction gate field-effect transistors (JFET) and insulated gate bipolar transistors. Furthermore, p-channel transistors or some combination of n-channel and p-channel transistors may also be used in place of the transistors illustrated in FIGS. 1, 2, and 3.

Figure 4:
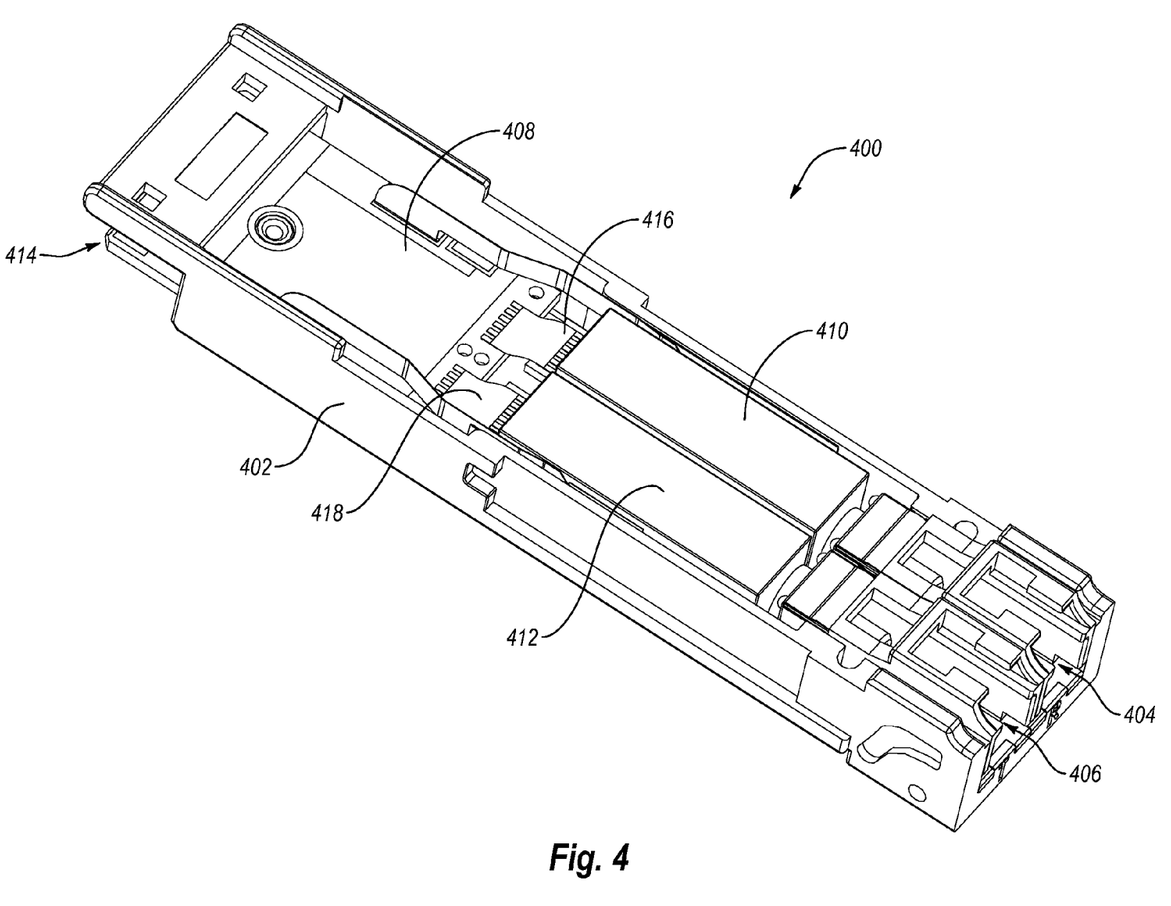
FIG. 4 is a perspective view of an example optoelectronic module that may include a driver circuit.

FIG. 4 is a perspective view of an example optoelectronic module 400 (hereinafter "module 400") that may include a driver circuit 422, arranged in accordance with at least some embodiments described herein. The module 400 may be configured for use in transmitting and receiving optical signals in connection with a host device (not shown).

As illustrated, the module 400 may include, but is not limited to, a bottom housing 402, a receive port 404, and a transmit port 406, both defined in the bottom housing 402; a PCB 408 positioned within the bottom housing 402, the PCB 408 including the driver circuit 422 and a first circuit 420 positioned thereon; and a receiver optical subassembly (ROSA) 410 and a transmitter optical subassembly (TOSA) 412 also positioned within the bottom housing 402. An edge connector 414 may be located on an end of the PCB 408 to enable the module 400 to electrically interface with the host device. As such, the PCB 408 facilitates electrical communication between the host device and the ROSA 410 and the TOSA 412.

The module 400 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 400 may be configured for optical signal transmission and reception at various distinct wavelengths using wavelength division multiplexing (WDM) using one of various WDM schemes, such as Coarse WDM, Dense WDM, or Light WDM.

Furthermore, the module 400 may be configured to support various communication protocols including, but not limited to, Fibre Channel and High Speed Ethernet. In addition, although illustrated in a particular form factor in FIG. 4, more generally, the module 400 may be configured in any of a variety of different form factors including, but not limited to, the Small Form-factor Pluggable (SFP), the enhanced Small Form-factor Pluggable (SFP+), the 10 Gigabit Small Form-factor Pluggable (XFP), the C Form-factor Pluggable (CFP), and the Quad Small Form-factor Pluggable (QSFP) multi-source agreements (MSAs).

The ROSA 410 may house one or more optical receivers, such as photodiodes, that are electrically coupled to an electrical interface 416. The one or more optical receivers may be configured to convert optical signals received through the receive port 404 into corresponding electrical signals that are relayed to the host device through the electrical interface 416 and the PCB 408. In some embodiments, the ROSA 410 may include a driver circuit, such as one of the driver circuits 102, 202, or 300 of FIGS. 1, 2, and 3 to driver signals from the ROSA 410 to the PCB 408. For example, the driver circuit may be used to drive a signal from a transimpedance amplifier inside the ROSA 410. Alternately or additionally, the driver circuit may be part of the PCB 408 and may be used to drive a signal from the PCB 408 to the host device.

The TOSA 412 may house one or more optical transmitters, such as lasers, that are electrically coupled to another electrical interface 418. The one or more optical transmitters may be configured to convert electrical signals received from the host device by way of the PCB 408 and the electrical interface 418 into corresponding optical signals that are transmitted through the transmit port 406.

The module 400 illustrated with respect to FIG. 4 is one architecture in which embodiments of the present disclosure may be employed. It should be understood that this specific architecture is only one of countless architectures in which embodiments may be employed. The scope of the present disclosure is not intended to be limited to any particular architecture or environment.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions include been described in detail, it should be understood that the various changes, substitutions, and alterations could be made hereto without departing from the spirit and scope of the invention.

What is claimed is:

1. A circuit comprising:
    first and second input nodes configured to receive a differential input signal with a first voltage swing;
    first and second output nodes;
    an amplification circuit coupled to the first and second input nodes, the amplification circuit configured to receive the differential input signal and to generate first and second intermediate signals based on the differential input signal, both the first and second intermediate signals include voltage swings that are larger than the first voltage swing;
    a first active device coupled to the first output node and the amplification circuit, the first active device configured to conduct based on the first intermediate signal;
    a second active device coupled to the second output node and the amplification circuit, the second active device configured to conduct based on the second intermediate signal; and
    an output circuit coupled to the amplification circuit and the first and second output nodes, the output circuit including:
        an adjust circuit configured to receive and adjust the first and second intermediate signals to generate adjusted first and second intermediate signals;
        a first output transistor coupled to the first output node and configured to conduct based on the adjusted second intermediate signal such that the output circuit outputs a first output signal on the first output node; and
        a second output transistor coupled to the second output node and configured to conduct based on the adjusted first intermediate signal such that the output circuit outputs a second output signal on the second output node,
    wherein the adjust circuit adjusts the first and second intermediate signals such that the first and second output transistors conduct in a saturation region.

2. The circuit of claim 1, wherein the first and second output nodes are configured to be coupled to respective first and second signal transmission lines, each of the first and second signal transmission lines including a first input impedance, wherein an output resistance of both of the first and second active devices is approximately equal to the first input impedance.

3. The circuit of claim 2, wherein the amplification circuit includes a resistance that includes a resistive value that is at least twice the first input impedance.

4. The circuit of claim 1, wherein the amplification circuit and the output circuit are coupled between a voltage supply and ground, wherein the voltage supply supplies a voltage that is less than 2 volts.

5. The circuit of claim 1, wherein the first voltage swing is approximately 200 millivolts and the voltage swings of the first and second intermediate signals are at least 450 millivolts.

6. The circuit of claim 1, wherein the output circuit outputs the first output signal on the first output node when the first active device does not conduct and the output circuit outputs the second output signal on the second output node when the second active device does not conduct, wherein the first and second output signals form a differential output signal.

7. The circuit of claim 1, wherein the amplification circuit includes a driver portion and a load portion, wherein the driver portion generates first and second currents based on the differential input signal, wherein the first and second intermediate signals are voltage signals generated by the load portion using the first and second currents.

8. The circuit of claim 1, wherein the differential input signal includes a first signal and a second signal, wherein the first signal is received by the first input node and the first intermediate signal is generated based on the first signal and the second signal is received by the second input node and the second intermediate signal is generated based on the second signal.

9. The circuit of claim 8, further comprising a tap circuit configured to selectively apply a modified version of the first signal to the first intermediate signal and to selectively apply a modified version of the second signal to the second intermediate signal.

10. The circuit of claim 9, wherein the modified version of the first signal is an earlier version of the first signal or a later version of the first signal.

11. A circuit comprising:
first and second input nodes configured to receive a differential input signal;
first and second output nodes;
first and second intermediate nodes;
first and second resistances;
a first amplification transistor coupled to the first input node, the first resistance, and the first intermediate node, the first amplification transistor and the first resistance configured to generate a first intermediate signal on the first intermediate node based on the differential input signal;
a second amplification transistor coupled to the second input node, the second resistance, and the second intermediate node, the second amplification transistor and the second resistance configured to generate a second intermediate signal on the second intermediate node based on the differential input signal;
a first active device coupled to the first output node and the first intermediate node;
a second active device coupled to the second output node and the second intermediate node;
an adjust circuit configured to receive and to adjust the first and second intermediate signals to generate adjusted first and second intermediate signals;
a first output transistor coupled to the first output node and configured to conduct based on the adjusted second intermediate signal; and
a second output transistor coupled to the second output node and configured to conduct based on the adjusted first intermediate signal,
wherein the adjust circuit adjusts the first and second intermediate signals such that the first and second output transistors conduct in a saturation region.

12. The circuit of claim 11, wherein the differential input signal includes a first voltage swing that is less than a second voltage swing of the first intermediate signal and that is less than a third voltage swing of the second intermediate signal.

13. The circuit of claim 11, wherein a gate of the first active device is coupled to the first intermediate node and a source of the first active device is coupled to the first output node, and a gate of the second active device is coupled to the second intermediate node and a source of the second active device is coupled to the second output node.

14. The circuit of claim 11, wherein the first output transistor conducts when the first active device does not conduct, and the second output transistor conducts when the second active device does not conduct.

15. The circuit of claim 11, wherein the first and second output nodes are configured to be coupled to respective first and second transmission lines, each of the first and second transmission lines including a first input impedance, wherein an output resistance of both of the first and second active devices is approximately equal to the first input impedance.

16. The circuit of claim 15, wherein each of the first and second resistances include a resistive value that is at least twice the first input impedance.

17. The circuit of claim 11, wherein a drain of first output transistor is coupled to the first output node and a drain of the second output transistor is coupled to the second output node.

18. A circuit comprising:
a first input node configured to receive a first signal of a differential input signal;
a second input node configured to receive a second signal of the differential input signal;
first and second output nodes;
an amplification circuit coupled to the first and second input nodes, the amplification circuit configured to receive the first signal and the second signal of the differential input signal and to generate a first intermediate signal based on the first signal of the differential input signal and to generate a second intermediate signal based on the second signal of the differential input signal;
a tap circuit configured to selectively apply a modified version of the first signal to the first intermediate signal and to selectively apply a modified version of the second signal to the second intermediate signal;
a first active device coupled to the first output node and the amplification circuit, the first active device configured to conduct based on the first intermediate signal;
a second active device coupled to the second output node and the amplification circuit, the second active device configured to conduct based on the second intermediate signal; and
an output circuit coupled to the amplification circuit and the first and second output nodes, the output circuit configured to output first and second output signals on the first and second output nodes based on the respective first and second intermediate signals.

19. The circuit of claim 18, wherein a voltage swing of the differential input signal is approximately 200 millivolts and a voltage swing of each of the first and second intermediate signals is at least 450 millivolts.

20. The circuit of claim 18, wherein the modified version of the first signal is an earlier version of the first signal or a later version of the first signal.

* * * * *